United States Patent
Takeuchi et al.

(10) Patent No.: US 6,879,528 B2
(45) Date of Patent: Apr. 12, 2005

(54) CONTROL METHOD OF NONVOLATILE MEMORY

(75) Inventors: Akio Takeuchi, Takatsuki (JP); Shigekazu Kogita, Ibaraki (JP); Kazuya Iwata, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 90 days.

(21) Appl. No.: 10/362,846

(22) PCT Filed: Jun. 24, 2002

(86) PCT No.: PCT/JP02/06313

§ 371 (c)(1),
(2), (4) Date: Feb. 27, 2003

(87) PCT Pub. No.: WO03/003219

PCT Pub. Date: Jan. 9, 2003

(65) Prior Publication Data

US 2003/0189860 A1 Oct. 9, 2003

(30) Foreign Application Priority Data

Jun. 28, 2001 (JP) ........................ 2001-197388

(51) Int. Cl.$^7$ ................................. G11C 7/00
(52) U.S. Cl. .............. 365/200; 365/185.09; 365/185.29; 365/185.33
(58) Field of Search ............................ 365/200, 185.09, 365/185.29, 185.33

(56) References Cited

U.S. PATENT DOCUMENTS 5,978,273 A * 11/1999 Shigemura ............. 365/185.29
6,421,279 B1 * 7/2002 Tobita et al. .......... 365/189.01

FOREIGN PATENT DOCUMENTS

| JP | 5-216780 A | 8/1993 |
| JP | 11282765 A | 10/1999 |
| JP | 2000-330850 A | 11/2000 |

* cited by examiner

Primary Examiner—Vu A. Le
Assistant Examiner—Pho M. Luu
(74) Attorney, Agent, or Firm—Akin Gump Strauss Hauer & Feld, L.L.P.

(57) ABSTRACT

A control method of nonvolatile memory is provided, wherein it does not happen that data which ought to have been erased are not erased, or data which ought to have been written are lost even if a forced interruption takes place due to shutdown of a power source for a memory device, a reset command, or the like occurs when data are written in a last page of a block, the block is validated by setting the block data validation flag provided in the redundant area of the last page of block 0 (valid). Furthermore, a counter judges whether the data is new or old, and data can be protected even if the above-mentioned solution cannot be implemented.

6 Claims, 13 Drawing Sheets

| BLOCK | PAGE | DATA AREA (512 BYTES) | REDUNDANT AREA (16 BYTES) |
|---|---|---|---|
| PHYSICAL BLOCK 1 | PAGE 1 | | |
| | PAGE 2 | | |
| | : | : | : |
| | PAGE 32 | | |
| PHYSICAL BLOCK 2 | PAGE 1 | | |
| | PAGE 2 | | |
| | : | : | : |
| | PAGE 32 | | |
| : | : | : | : |
| PHYSICAL BLOCK 4096 | PAGE 1 | | |
| | PAGE 2 | | |
| | : | : | : |
| | PAGE 32 | | |

32 PAGES 16 k BYTES

FIG. 2

| BLOCK | PAGE | DATA AREA (512 BYTES) | REDUNDANT AREA (16 BYTES) |
|---|---|---|---|
| PHYSICAL BLOCK 1 | PAGE 1 | | |
| | PAGE 2 | | |
| | ⋮ | ⋮ | ⋮ |
| | PAGE 32 | | |
| PHYSICAL BLOCK 2 | PAGE 1 | | |
| | PAGE 2 | | |
| | ⋮ | ⋮ | ⋮ |
| | PAGE 32 | | |
| ⋮ | ⋮ | ⋮ | ⋮ |
| PHYSICAL BLOCK 4096 | PAGE 1 | | |
| | PAGE 2 | | |
| | ⋮ | ⋮ | ⋮ |
| | PAGE 32 | | |

32 PAGES 16 k BYTES

FIG. 5

| LOGICAL ADDRESS | PHYSICAL ADDRESS |
|---|---|
| 0 | 1 |
| 1 | 3 |
| 2 | 4 |
| 3 | 0 |
| 4 | 1 |
| -------- | -------- |

CONTROL METHOD OF NONVOLATILE MEMORY

CROSS-REFERENCE TO RELATED APPLICATION

This application is a Section 371 of International Application No. PCT/JP0 2/06313, filed Jun. 24, 2002, the disclosure of which is incorporated herein by reference.

TECHNICAL FIELD

The present invention relates to nonvolatile semiconductor memory and control method of nonvolatile semiconductor memory.

BACKGROUND ART

In recent years, storage devices using nonvolatile memories such as flash memories receive much attention as memory devices of portable apparatus handling music or video image data.

On the structure of the flash memory, explanation is given by taking the case of a 512M bits NAND type flash memory as an example.

FIG. 2 is a structural example of physical block of a 512M bits flash memory. One flash memory consists of 4096 blocks. This block forms a basic unit of erasing. One block is further divided into 32 pages. One page forms a basic unit of readout and writing. Capacity of one page is 528 bytes, among which 512 bytes are for a data area and remaining 16 bytes are for a redundant area. The data area is an area to be used by the user, the redundant area is an area to be used by the system control part of a nonvolatile flash memory storage device.

Each data of a flash memory of an embodiment is 1 at an erased state (where it is erased and is not recorded). Therefore, to write 1 in a flash memory may be replaced by writing nothing.

FIG. 3 is an example of a structural drawing of a physical block of a prior art flash memory. FIG. 3 represents main data written in a redundant area of one physical block. In a redundant area of an initial page, three, which are a writing done flag 101, a logical address 102 and a flag 1 103 that is an block data invalidation flag, are placed. On these individual data, explanation is given later.

FIG. 4 is a drawing showing a relationship between the logical address and the physical address. In a nonvolatile memory storage device using flash memories, a logical address specified from outside and a physical address placed in a flash memory are not same in general. This is because such inconvenience happens as that, if making those addresses same, addresses of blocks at which malfunction occurs in the flash memory cannot be used, applications are made to bear load or, the block corresponding to that address easily exceeds a guaranteed number of rewriting times in a short time period, resulting in a short life time in such a system in which writing occurs frequently in a particular address.

Therefore, as is shown in FIG. 3, the physical block memorizes which logical address this physical block is assigned within the redundant area. In general the system control part of the nonvolatile memory storage device reads out the logical address information written in the redundant areas of all the flash memories at the starting time of power source and then generates a logical-physical address conversion table for converting logical addresses and physical addresses on a RAM as shown in FIG. 5. The system control part identifies a physical address with respect to a logical address specified from outside using the logical-physical address conversion table at the time of command process, and then makes access to the physical address.

Using FIG. 6 to FIG. 8, explanation will be given on a prior art general writing process. FIG. 6 is a one-block writing process schematic flowchart. FIG. 7 is a detailed flowchart of a new data writing process part in a step 603 of FIG. 6. FIG. 8 is a detailed flowchart of a redundant area data generating process part in a step 706 of FIG. 7.

In FIG. 6, at a step 601 erased blocks are searched from the entry table. The entry table is a lookup table of blocks which are already erased and not yet written. The entry table is a table generated on a RAM by reading out the writing done flags in the redundant areas of all of the flash memories at the starting time of the power-source, similar to the above-mentioned logical-physical address conversion table. Updating the entry table at a step 602, thereby erased blocks are acquired. Data are written in the acquired block at a step 603 (details are shown in FIGS. 7 and 8). At a step 604 it is judged from the logical-physical address conversion table whether there is an old block or not. In case where there is an old block, process proceeds to a step 605. At the step 605, 0 (invalid) is overwritten on the flag 1 located in the redundant area of the top page of the old block, thus invalidating the old block. In case where there is not an old block, process proceeds to a step 606 skipping the step 605. At the step 606, the physical address of the old block of the logical-physical address conversion table is rewritten to the physical address of the new block, and this flowchart is terminated.

Now, there are two methods in the erasing process of the old data; a method in which data are erased physically and a method in which an apparent erasing is done by marking the flag representing that data are invalid and then physical erasing is done at a different timing. The latter is employed generally and the flowchart of FIG. 6 has also been explained in this method. This is because the overwriting of flags is faster than the physical erasing in the flash memory. And it is because the writing speed can be made faster as the whole by an amount of time during which writing and erasing are simultaneously done by erasing invalid-marked blocks physically simultaneously while writing is done in other flash memory chip in a nonvolatile memory device comprised of a plural number of flash memory chips.

In FIG. 7, at a step 701 a page counter provided in the RAM is set the initial value (1). At a step 702, it is judged whether it is the page in which the data given from the host is to be written or not. If it is the page in which the data given from the host is to be written, process proceeds to a step 703 and data are inputted by an amount of one page from the host. If it is not the page in which the data given from the host is to be written, process proceeds to a step 704 and data are read out by an amount of one page from the old block. At a step 705 data are set in the data area, and at a step 706 data are set in the redundant area (details are shown in FIG. 8). At a step 707, one page is written. At a step 708, 1 is added to the page counter. At a step 709, it is judged whether the page counter is equal to or more than 33 or not. Process from step 702 to step 709 is repeated during a time period that the page counter is less than 33. When the page counter becomes 33, this flowchart is terminated.

The above-mentioned process from the step 702 to the step 704 in FIG. 7 is a process necessary because a unit of writing is a page while a unit of erasing is a block, and it is called as a wrap up process. Namely, since previous data should be retained as they were in the pages except the writing page when writing data are given in a page unit from outside, the data from an old block which are to be changed are read out, these data are combined, and writing of an amount of one block is done. Depending on whether it is a starting page or a terminating page of writing, there are a first-half wrap up process and a second-half wrap up process.

In FIG. 8, at a step 801, whether it is the top page or not is judged. In the case of the top page, process proceeds to a step 802 and the writing done flag 101 is set 0 (Writing was done.). At a step 803, a logical address assigned from the host is set in the logical address 102. At a step 804, the flag 1 103 is set 1 (not invalid), and then this flowchart is terminated. At the step 801, in the case where it is not the top page, this flowchart is terminated.

In such a system, in a case where a forced interruption is caused by shutdown of a power supply for the memory device, a reset command to the memory device or the like during overwriting of the blocks, it results in two physical addresses existing for one identical logical address. This phenomenon takes place in such a case where the interruption takes place during writing of new block data (step 603), or after the new block data writing process (step 603) has been completed and before the old block data (step 604) ought to have been invalidated in the above-mentioned process.

Let us consider a method of registering the physical address of either block in the logical-physical address conversion table and leaving the other block in which block data and a logical address are written as they are in the process of generating an initial logical-physical address conversion table after this phenomenon took place. In this case, when the power supply is turned on again after erasing the block that was registered in the above-mentioned state, the physical address of the other block (block left as it is), which ought to have been erased, is registered for the logical address in a logical-physical address conversion table which is newly generated in a RAM. As a result, such a phenomenon that the address which ought to have been erased is not actually erased happens.

And in the case where the interruption takes place under the state in which the same logical address is written in a block in which old block data are written and in a block in which new block data are written, and then the power supply is turned on again, there is a possibility that the physical address of the block in which old block data are written is registered in the logical-physical address conversion table. In this case, new block data result in being lost. A phenomenon crucial to the system takes place after all.

Therefore conventionally, a process of invalidating one block and dissolving duplication has been conducted in the case where duplication of physical addresses for the same logical address is found at the time of generating a logical-physical conversion table at the beginning. As for the selecting method of these two blocks, such a method has been employed wherein two block data were both read out and block without error was selected by confirming the error correction code provided on each page, or a block in which data ware written up to the last page was selected.

However, necessity of executing a generation process of the logical-physical address conversion table at high speed is emerging in connection with the increase of the capacity of flash memories and nonvolatile memory storage devices, and the above-mentioned duplication resolving process is now becoming an large obstacle against realizing the high-speed process. Although it is commonly employed to generate a logical-physical address conversion table by hardware, a method, in which process of the address duplication information are taken over by the software, largely lowers the speed of generating the logical-physical address conversion table. Even if all the processes are done by hardware, if a conventional complicated decision process is employed, area size occupied by the hardware increases, eventually introducing a cost increase. Furthermore, even in such a state in which duplicated blocks are both written correctly up to the last page physically, there is a case where a correct block should be selected depending on the contents of the data area. For example, it is a case where process of invalidating the old data only after confirming that they are correct by confirming the error correction codes included in those data or by judging whether those data values are abnormal values or not in an overwriting process and after new data are written is necessary for data. In such a case, the problem cannot be solved by such a method as simply selecting the data having a later writing time. For example, although there is necessity of executing processes of scanning up to the data area depending upon individual situation of data, then determining and selecting a correct block, it is difficult to realize all of these processes by hardware.

The present invention has been done in consideration of such problems. It purports to offer a memory device wherein the logical-physical address conversion table can be generated at high speed along with ensuring the reliability with addition of a simple configuration.

DISCLOSURE OF INVENTION

The present invention has the following configuration in order to solve the above-mentioned problems.

A control method of a nonvolatile memory from an aspect of the present invention is the control method of a nonvolatile memory having a plural number of blocks, wherein the block has a plural number of pages, the page has data area for writing data and redundant area, the redundant area of the initial page of the block has a block data invalidation flag indicating whether the data written in the block are invalid or not and indicating that the data are not invalid at the state that the nonvolatile memory is erased, and the redundant area of the last page of the block has a block data validation flag indicating whether the data written in the block are valid or not and indicating that the data are not valid at the state that the nonvolatile memory is erased, having: a data writing step of writing data in the data area; and a validation step of making the block data validation flag of the block having the data area in which the data are written to indicate that the data are valid.

The above-mentioned control method of a nonvolatile memory from other aspect of the present invention has further a selecting step of selecting, by hardware or software, a method in which the validation step is executed simultaneously with or succeeding the data writing step or a method in which a data correctness check is executed, after the data writing step and then the validation step is executed.

The above-mentioned control method of a nonvolatile memory from another aspect of the present invention, in the case where original data are updated to new data, executes simultaneously the validation step on the block in which the new data are written and the invalidation step of making the block data invalidation flag of the block in which the original data are written to indicate that the original data are invalid.

In the above-mentioned control method of a nonvolatile memory from further another aspect of the present invention, the redundant area further has logical addresses and history information of the data written in the block; and in the case where there are a plural number of blocks having the same logical address, it has further a judgment step of judging the data of which block is valid at present, based on the history information.

"History information" is information that makes clear whether data are new or old. For example, it is a counter value or the time and date.

A nonvolatile memory from further another aspect of the present invention has a plural number of blocks, wherein the block has a plural number of pages; the page has data area for writing data and redundant area; the redundant area of the initial page of the block has a block data invalidation flag indicating whether the data written in the block are invalid or not and indicating that the data are not invalid at the state that the nonvolatile memory is erased; the redundant area of the last page of the block has a block data invalidation flag indicating whether the data written in the block are valid or not and indicating that the data are not valid at the state that the nonvolatile memory is erased; and the block data validation flag of at least one block indicates that the data are valid.

In the above-mentioned nonvolatile memory from further another aspect of the present invention, the redundant area further has logical addresses and history information of the data written in the block.

By the present invention, it is possible to realize the control of a memory device that reduces largely the risk of duplicating physical addresses for the same logical address due to interruption during overwriting action, ensures reliability, and is capable of high speed operation.

The novel features of the invention will be hereinafter fully described and particularly pointed out in the appended claims, and the construction and details of the invention, together with other objects and features thereof, will become better understood and appreciated by reference to the following detailed description when considered in conjunction with the accompanying drawings.

BRIEF DESCRIPTION OF DRAWINGS

FIG. 2 is an example of configuration of a prior art flash memory physical block.

FIG. 5 is an example of a logical-physical address conversion table.

FIG. 10 is a schematic flowchart of a logical-physical address conversion table generation process of the present invention at the time of turning a power supply on.

It will be appreciated that all or part of the drawings are purely diagrammatic for illustrative purposes and do not necessarily present faithful depictions of the actual relative sizes and positions of the illustrated elements.

BEST MODE FOR CARRYING OUT THE INVENTION

Embodiments illustrating the best mode for carrying out the invention will be described below by way of example with reference to the accompanying drawings.

<<Embodiment 1>>

Using FIGS. 1, 6, 7 and 9, a memory device of an embodiment 1 of the present invention will be explained.

Figure 1:
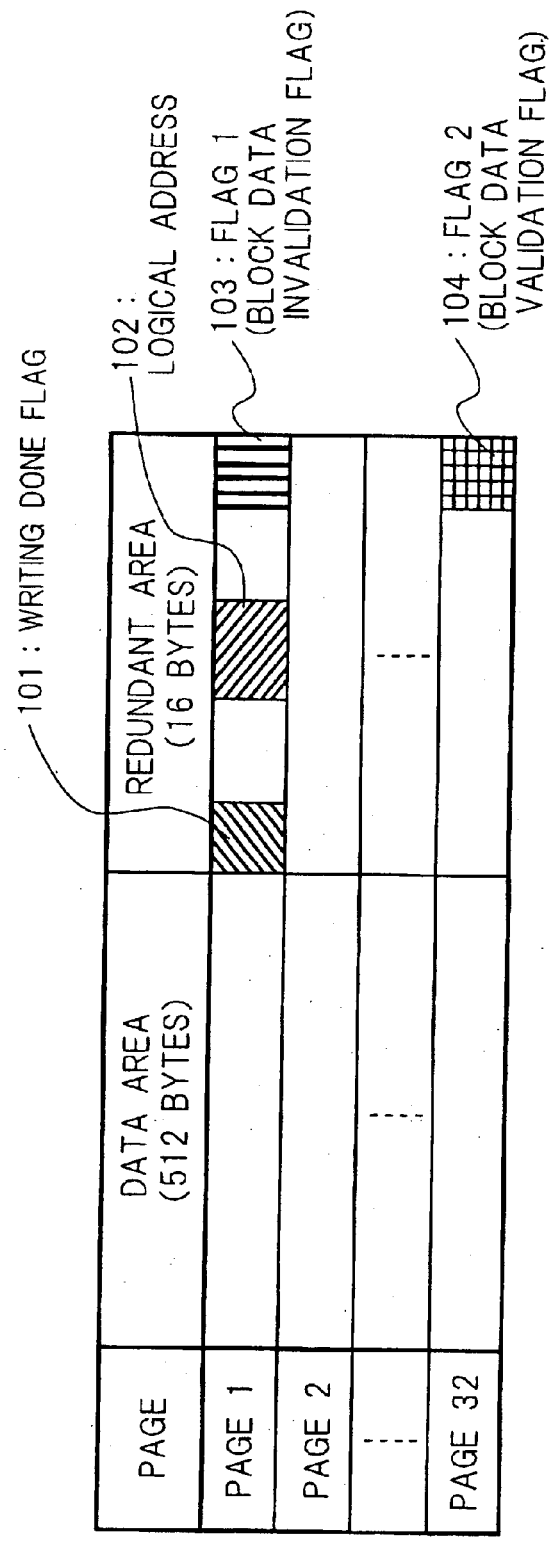
FIG. 1 is an example of a drawing showing a configuration in a flash memory physical block of an embodiment 1 of the present invention.
Figure 3:
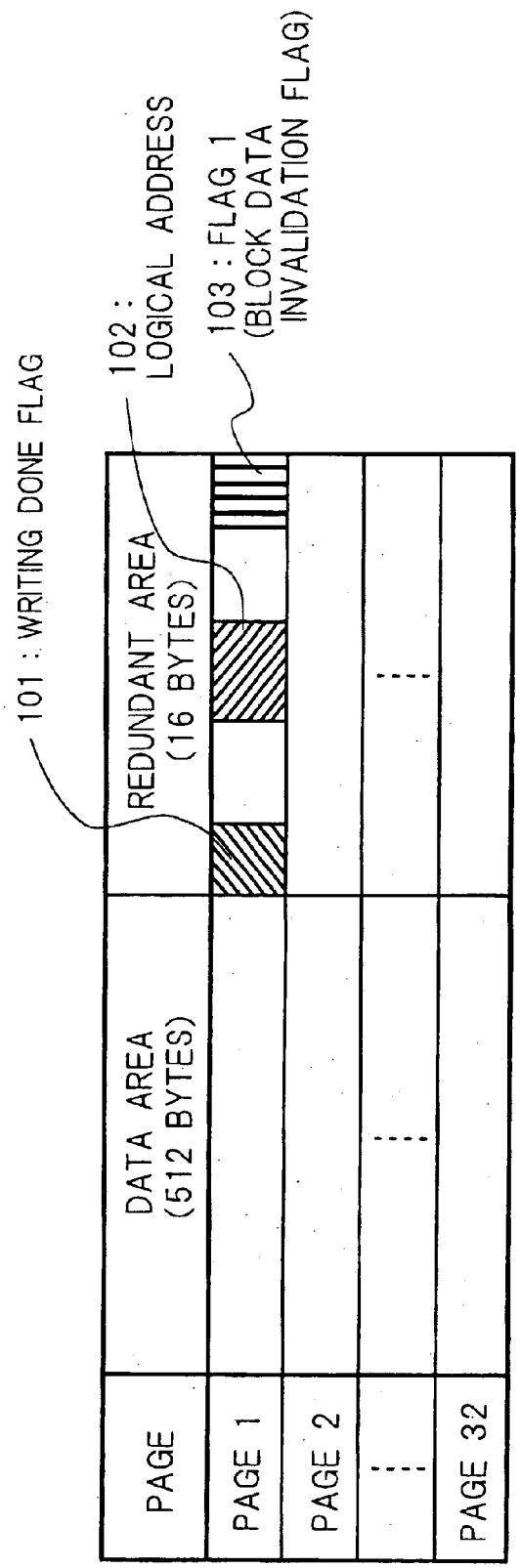
FIG. 3 is an example of a drawing showing a configuration in a prior art flash memory physical block.
Figure 4:
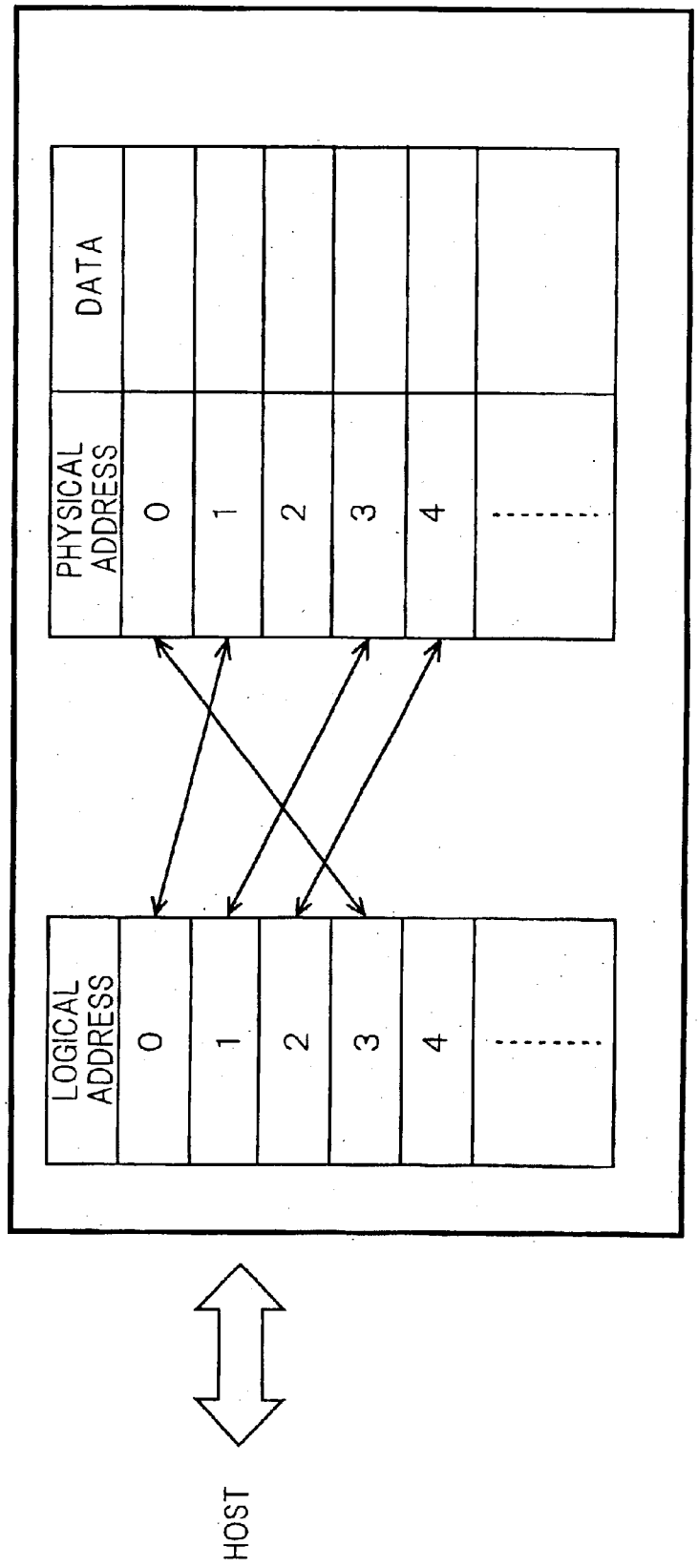
FIG. 4 is a drawing showing the relationship between the logical address and the physical address.

FIG. 1 is an example of a drawing showing a configuration in a physical block of a flash memory of an embodiment 1 of the present invention. FIG. 1 shows main data written in a redundant area of one physical block. In a redundant area of a top page, three of a writing done flag 101, a logical address 102 and a flag 1 103, which is a block data invalidation flag, are located. In a redundant area of a last page, a flag 2 104, which is a block data validation flag, is located. Difference from a prior art example (FIG. 3) is that the flag 2 104 is added.

The writing done flag 101 is a flag representing that writing was done in this block. The writing done flag 101 represents that its block is not written yet when it is 1, whereas it represents that its block is written when it is 0. The block can be made to be already written by writing a fixed value 0 in the writing done flag 101 when writing is done in the top page. Considering an interruption during the writing process of one block data, it is a necessary condition that the writing done flag 101 is in the top page where writing is done.

The logical address 102 represents a logical address to which its physical address is assigned at present. Although this is not necessarily to be located on the top page, it becomes necessary to locate it on the top page if the logical address 102 is used as the above-mentioned writing done flag 101 at the same time. For example, in the case where a logical address is expressed by 16 bits, the logical address 102 is assigned for being not yet written when a value of the logical address 102 is 0xffff which is an erased state, and it is determined that writing has been done when the value of the logical address 102 is other than 0xffff. In an actual logical address the logical address 102 can be used as the above-mentioned writing done flag at the same time by determining the rule that the logical address take value other than that value.

The flag 1 103 is the block data invalidation flag. The flag 1 103 represents that its physical block is not invalid when it is 1 and it represents that its physical block is invalid when 0 is written. This flag is kept to be 1 when new data are written, and it can be invalidated afterward by overwriting only this flag to be 0 when overwriting takes place on these data (when the data written in this block become old data). The overwriting of a flash memory is to do overwriting directly without erasing data.

The flag 2 104 is the block data validation flag. The flag 2 104 represents that its physical block is not valid when it is 1, and it represents that its physical block is valid when 0 is written. At the time when writing is done on the last page, this block can be made validated by writing 0 in the flag 2 104 at the same time. Considering interruption during the writing process of one block data, it is a necessary condition that the flag 2 is in the last page in which the writing is done.

As has been described above, since it is necessary to assign the writing done flag to the top page and the flag 2 to the last page, respectively, it is efficient to assign the logical address and the flag 1 also to either of those pages. That is, it is because that the table generation time can be shortened, as the lesser the number of scanned pages are, the shorter the readout time becomes at the generation of the initial logical-physical address conversion table.

Figure 6:
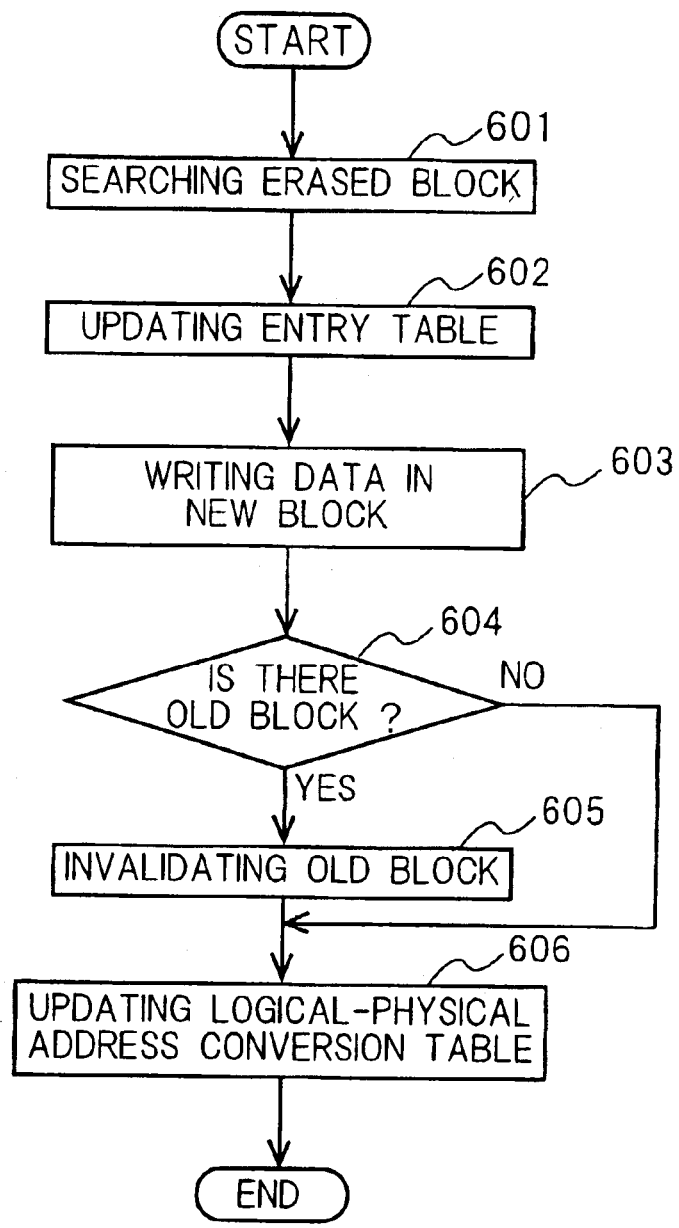
FIG. 6 is a schematic flowchart of a writing process of one block.
Figure 7:
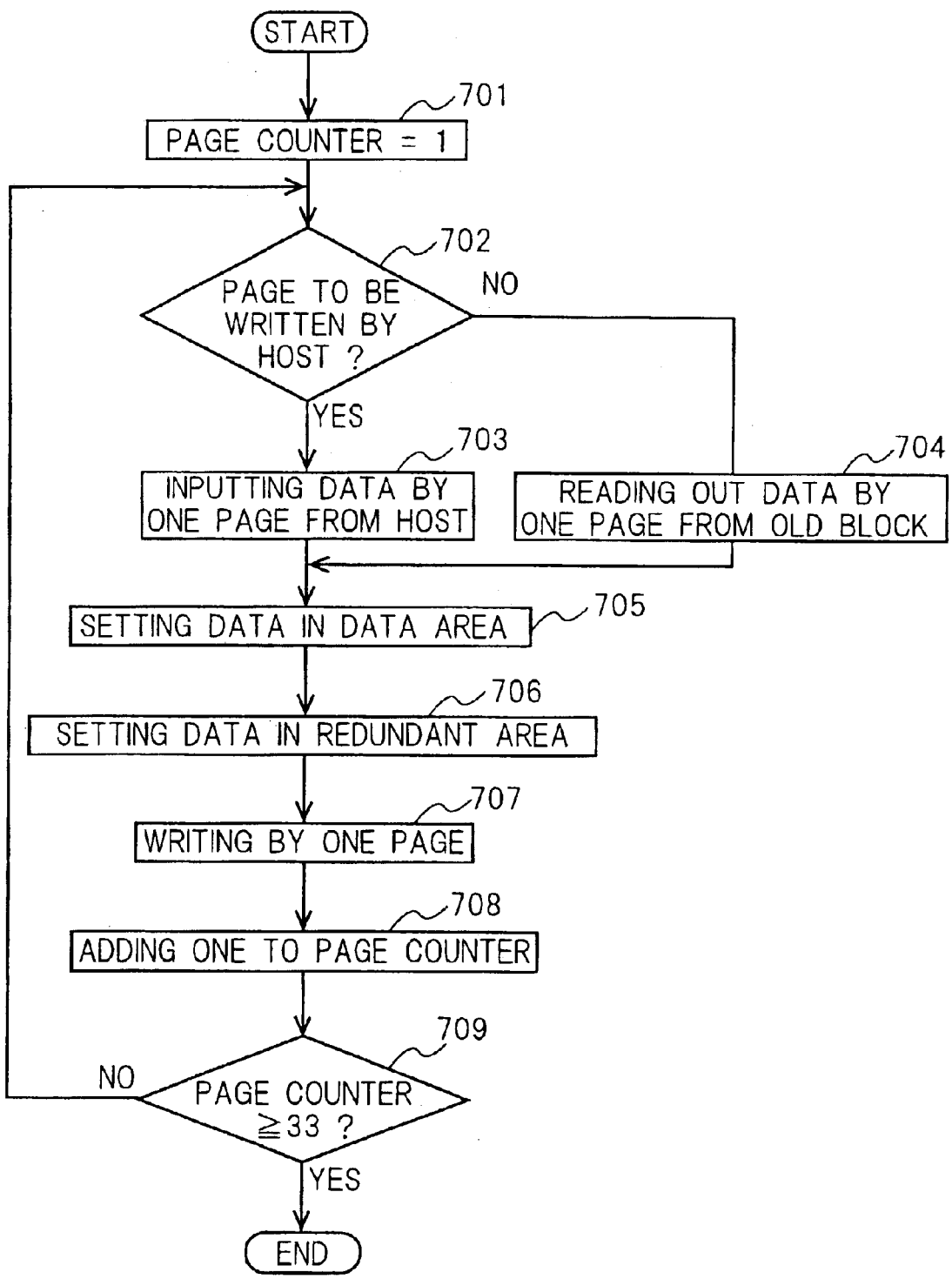
FIG. 7 is a detailed flowchart of a new data writing process section in FIG. 6.
Figure 9:
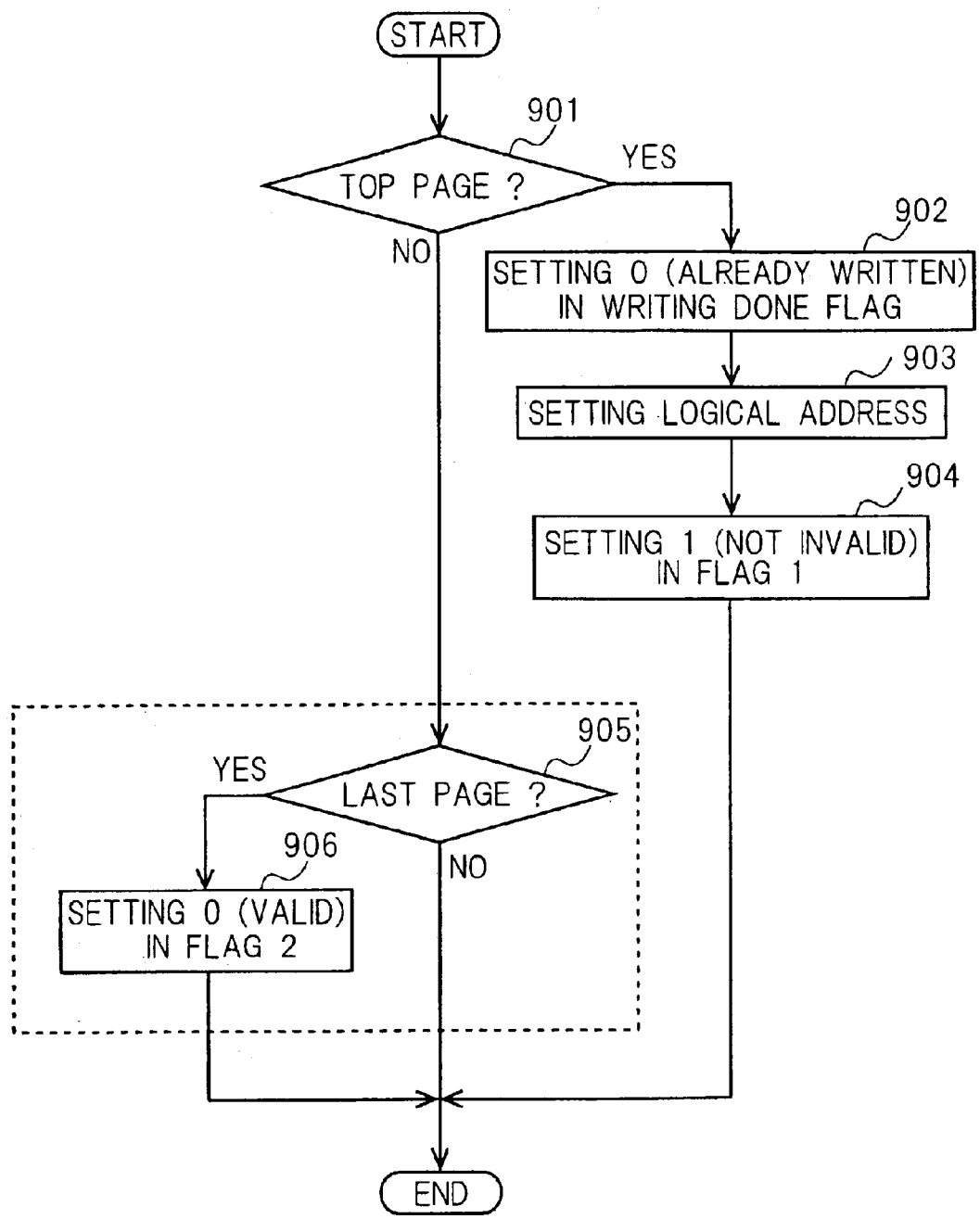
FIG. 9 is a detailed flowchart of a redundant area data generation process section in FIG. 7 of the embodiment 1 of the present invention.

Using FIGS. 6, 7 and 9, writing process of the memory system of the embodiment 1 of the present invention is described. FIG. 6 is a schematic flowchart of writing process of one block of the embodiment 1 of the present invention. FIG. 7 is a detailed flowchart of a new data writing process section in a step 603 of FIG. 6 of the embodiment 1 of the present invention. FIG. 9 is a detailed flowchart of a redundant area data generation processing section in a step 706 of FIG. 7 of the embodiment 1 of the present invention.

In FIG. 6, erased blocks are searched from an entry table at a step 601. At a step 602, the entry table is updated, and the erased blocks are secured. At a step 603 data are written in the secured blocks (details are shown in FIGS. 7 and 9). At a step 604, it is judged from the logical-physical address conversion table whether there are old blocks or not. In a case where there are old blocks, process proceeds to a step 605. At a step 605, 0 (invalid) is overwritten in the flag 1 in the redundant area of the top page of an old block, and thereby the old block is invalidated. In a case where there is no old block, process proceeds to a step 606, skipping the step 605. At the step 606, a physical address of the old block of the logical-physical address conversion table is rewritten to a physical address of a new block, and this flowchart is terminated.

Now, there are two different methods to erase old data; a method of erasing data physically; and a method of erasing data apparently by marking a flag indicating that the data are invalid and of erasing data physically at a different timing. The latter is implemented more generally, and the flowchart of FIG. 6 was also explained in this method. This is because overwriting of the flag is faster than the physical erasing in the flash memory. Furthermore, in a nonvolatile memory storage device comprised of a plural number of flash memory chips, writing speed as a whole becomes higher with an amount of time of writing and erasing being done simultaneously by erasing blocks which were marked to be invalid physically at the same time while writing is done in other flash memory chip.

In FIG. 7, a page counter provided in a RAM is set the initial value (1) at a step 701. At a step 702, it is judged whether the page is a page in which data given from a host are to be written or not. If the page is a page in which data given from the host are to be written, process proceeds to a step 703 and data are inputted by an amount of 1 page from the host. If the page is not a page in which data given from the host are to be written, process proceeds to a step 704 and data are read out by an amount of 1 page from the old block. At a step 705, data are set in the data area and at a step 706 data are set in the redundant area (details are shown in FIG. 9). At a step 707, an amount of 1 page is written. At a step 708 one is added to the page counter. At a page 709 it is judged whether the page counter is equal to or more than 33 or not. Steps from 702 to 709 are repeated while the page counter is less than 33. When the page counter becomes 33, this flowchart is terminated.

A process called wrap up takes place in a process of writing data which will not fill a block since a unit of writing is a page while a unit of erasing is a block. Namely, when data for writing are given in a page unit from outside, as for pages other than that page, data are read out from an old block which are to be changed, those data are combined together, and writing with an amount equal to a block is done since previous data should be retained as they are. These are steps from 702 to 704. There are a first-half wrap up process and a second-half wrap up process depending on the writing starting page or the terminating page.

In FIG. 9, at a step 901 it is judged whether it is a top page or not. In a case of a top page, process proceeds to a step 902 and a writing done flag 101 is set 0 (already written). At a step 903 a logical address assigned from the host is set in the logical address 102. At a step 904, the flag 1 103 is set 1 (not invalid), and then this flowchart is terminated. At the step 901, when it is not a top page, process proceeds to the step 905 and it is judged whether it is a last page or not. In the case where it is a last page, process proceeds to a step 906, the flag 2 104 is set 0 (valid), and then this flowchart is terminated. In the case where it is not a last page, this flowchart is terminated.

Hereupon, although only the above-mentioned flag and logical address data are explained in the present description, it is generally done to write some other data such as data error correction codes and the like besides those data are written in actual systems. However, they are omitted since these data have no relationship with the present invention.

Figure 8:
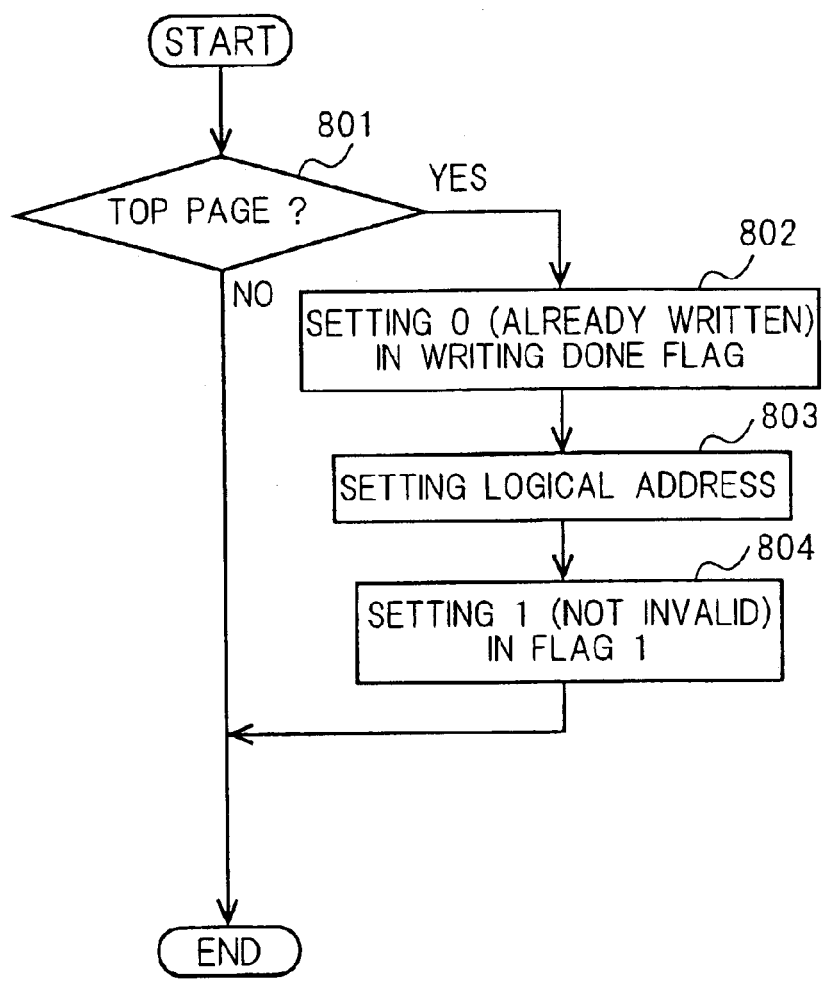
FIG. 8 is a detailed flowchart of a redundant area data generation process section in FIG. 7 of a prior art.

The difference from FIGS. 6 to 8 of the prior art is a point that a process of writing 0 (valid) in the flag 2 104 was added to the process of generating data for the redundant area as shown in FIG. 9. Although the data generation time is different somewhat, time necessary for writing data physically in the flash memory is the same.

Next, a judging method of block data using flags 1 and 2 is explained. Conventionally only flag 1 was used, but the following judgement becomes possible by using a combination of flags 1 and 2.

In the case where the block is already written, first, it is judged to be a valid block only when the flag 1=1 (not invalid) and the flag 2=0 (valid).

In the case where the flag 1=1 (not invalid) and the flag 2=1 (not valid), it is regarded as an invalid block where writing was interrupted and writing up to the last page could not be done. In this case, since it is before invalidating the old block when it is explained according to the above-mentioned process, the old block is selected and an action of writing new data itself is considered not to take place in the case where the power supply is turned on again.

In the case where the flag 1=0 (invalid) and the flag 2=0 (valid), it represents an invalidated block made by overwriting.

In the case where the flag 1=0 (invalid) and the flag 2=1 (not valid), it is regarded as an invalid block even though it cannot take place in the normal process.

As has been described above, it can be judged whether those block data are valid or invalid by using two flags even if interruption takes place at the time of a writing process.

Figure 10:
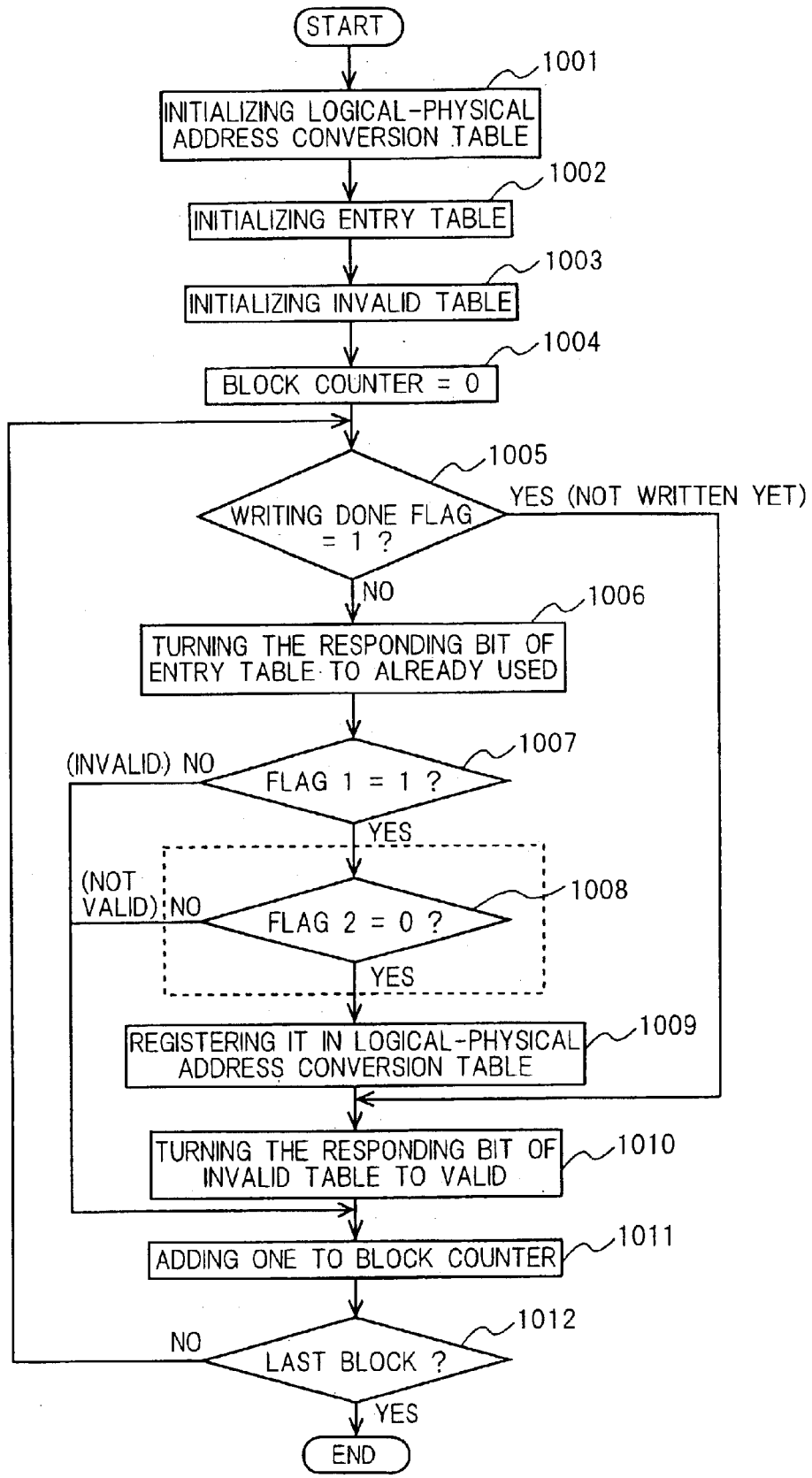

Using FIG. 10, a table generation process at the time of turning on the power supply in the first embodiment of the present invention is explained. FIG. 10 is a flowchart of a logical-physical address conversion table generation process.

In FIG. 10, a table area for generating the table is initialized at first. At a step 1001 the logical-physical address conversion table is initialized. All logical blocks on the logical-physical address conversion table are set in a state of being not assigned. At a step 1002 an entry table is initialized. All physical blocks on the entry table are set in an erased out state. At a step 1003, an invalid table is initialized. All physical blocks on the invalid table are set to be invalid. The invalid table is a table that indicates blocks, the data written in which are invalid and which are not yet erased, and that is provided in a RAM.

At a step 1004, a block counter provided on the RAM is initialized (block counter=0). At a step 1005, it is judged whether the writing done flag 101=1 (not yet written) or not. In the case where the writing done flag 101=1 (not yet written), a corresponding bit of the entry table is made to be as being already erased. In the present flowchart, this process is not needed since the entry table is entirely initialized (already erased) at the beginning. Process proceeds to a step 1010, and corresponding bit of the invalid table is validated. Terminating the process of this block, process proceeds to a step 1011. In the judgment at the step 1005, process is the same in the case where the logical address data is used as the writing done flag at the same time. Hereupon, it is not necessary to read out the last page in the case where it is not yet written.

At the step 1005, in the case where the writing done flag=0 (already written), process proceeds to a step 1006, and corresponding bit of the entry table are turned to be as being already used.

At a step 1007, it is judged whether the flag 1=1 (not invalid) or not. In the case where the flag 1=0 (invalid), the process of the block is terminated, and process proceeds to a step 1011. In the case where the flag 1=1 (not invalid), process proceeds to a step 1008, and it is judged whether the flag 2=0 (valid) or not. In the case where the flag 2=1 (not valid), the process of the block is terminated and process proceeds to a step 1011. In the case where the flag 2=0 (valid), the block is regarded as valid, process proceeds to a step 1009, and it is registered in the logical-physical address conversion table. At a step 1010, corresponding bit of the invalid table is validated. At the step 1011, one is added to the block counter. At a step 1012, it is judged whether it is the last block or not. In the case where it is not the last block, process returns to the step 1005, and the process of the next block is executed. In the case where it is the last block, this flowchart is terminated.

As has been described above, the process of FIG. 10 comprises processes of reading out the redundant areas of the top page and the last page successively up to the last block according to the physical addresses and of generating the logical-physical address conversion table, the entry table and the invalid table, and it has such a configuration that only the judgement of the step 1008 is added to the prior art process.

Hereupon, as shown in the present flowchart, a system provided with a table for memorizing blocks in which writing has been done and which are invalid (invalid table) is general in actual control. This is a kind of list of blocks to be erased and it is necessary to execute the erasing process of the invalidated blocks in parallel, utilizing the time for the process of writing data in other blocks in a system in which physical erasing is not executed at the time of overwriting and invalidation marking is done by the aforementioned flag 1. In this case, the table is used in the case of searching blocks to be erased. Therefore, data on this table are updated according to invalidation of old blocks not only at the initial time but also at the time of overwriting.

As has been described above, the risk of duplicating physical addresses for the same logical address caused by interruption during overwriting can be largely reduced without making big change from or big addition to the writing process and the logical-physical address conversion table generation process in the prior art.

<<Embodiment 2 >>

Figure 11:
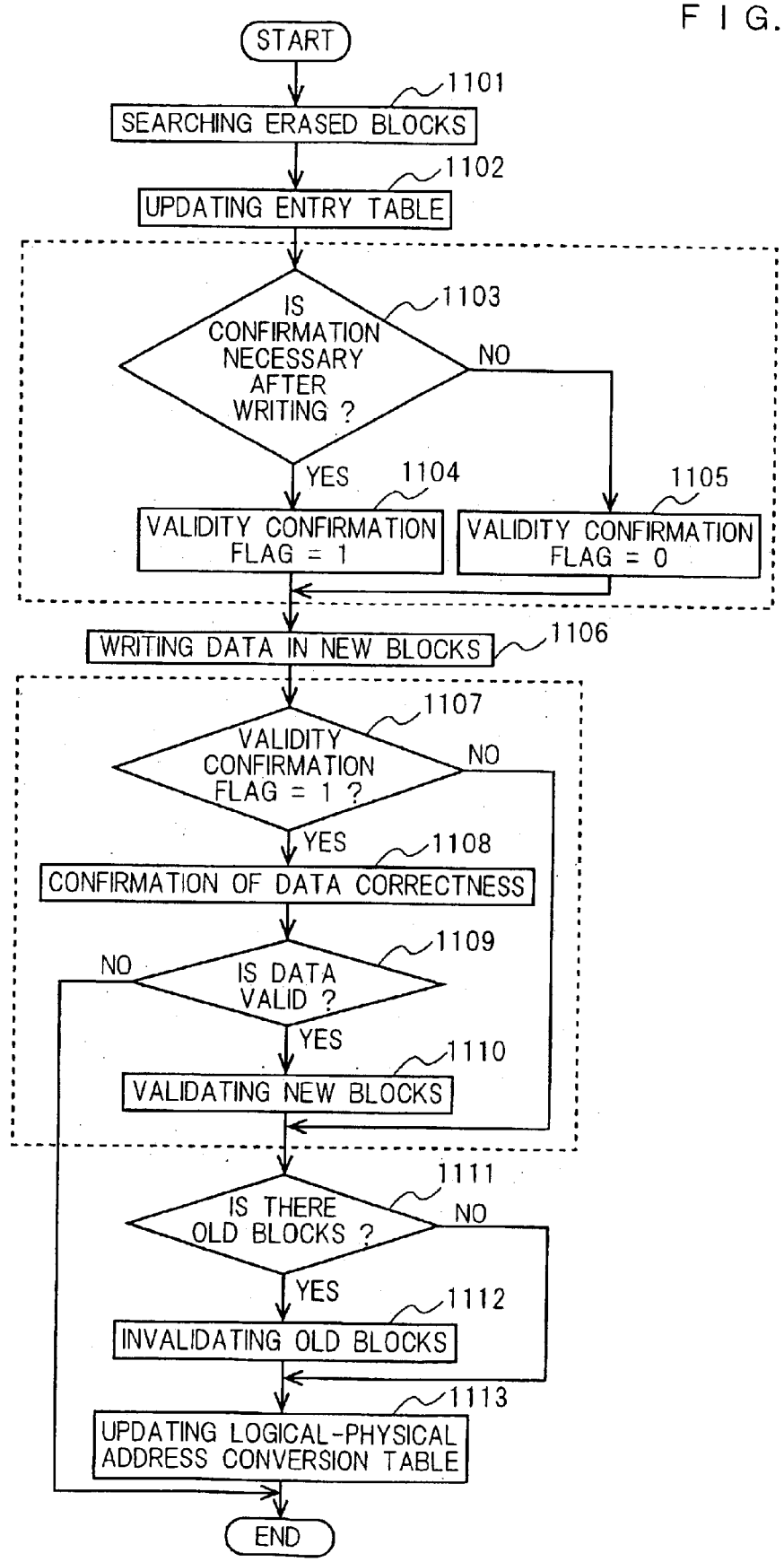
FIG. 11 is a schematic flowchart of a writing process of one block of an embodiment 2 of the present invention.
Figure 12:
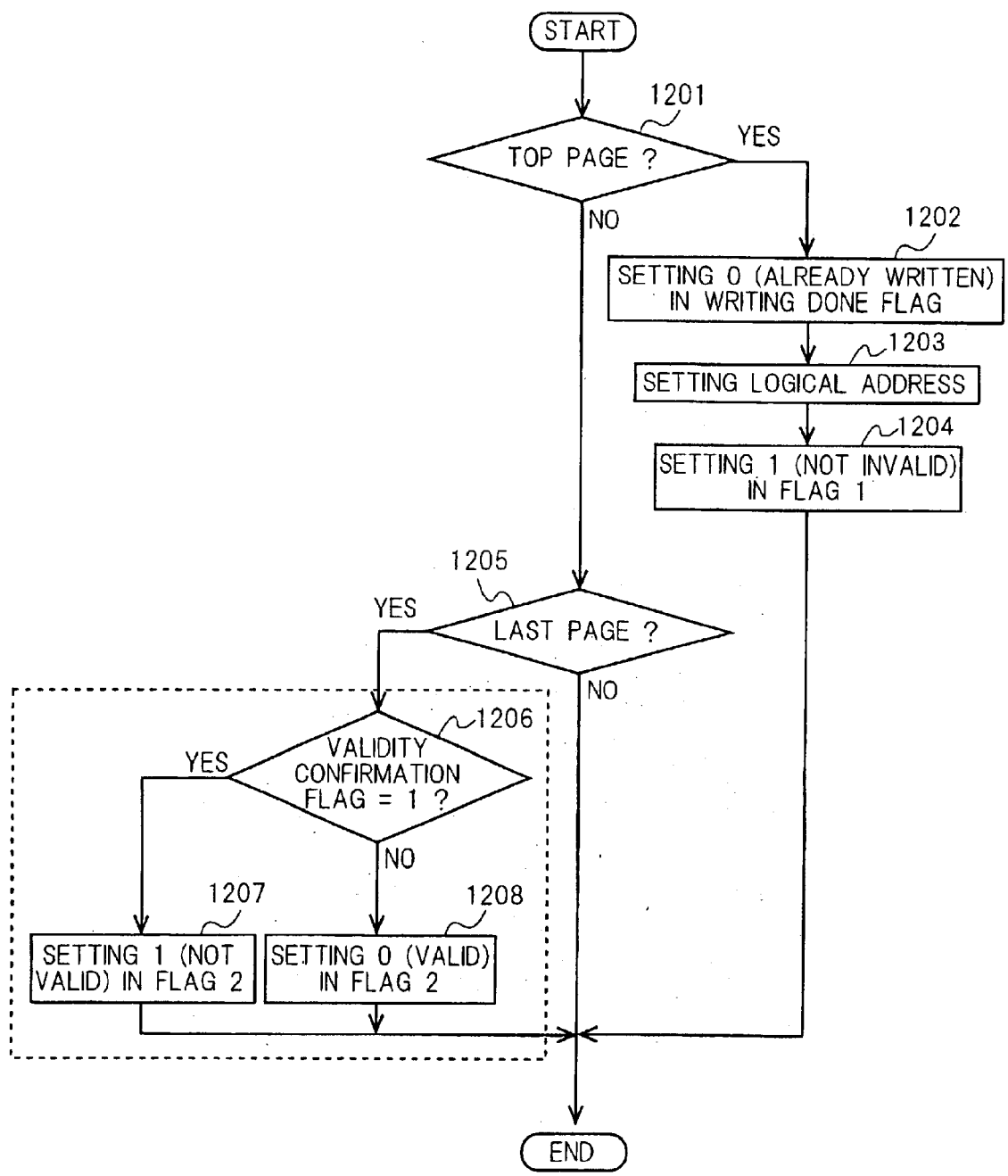
FIG. 12 is a detailed flowchart of a redundant area data generation process section in FIG. 7 of the embodiment 2 of the present invention.

Using FIGS. 7, 11 and 12, the writing process in the memory system of an embodiment 2 of the present invention will be explained. FIG. 11 is a schematic flowchart of the writing process of one block of the embodiment 2 of the present invention. The difference from the embodiment 1 (FIG. 6) is a point that judgment of data kind (from step 1103 to step 1105) and validation of new blocks (from step 1107 to 1110) are added. FIG. 12 is a detailed flowchart of a redundant area data generation processing part at the step 706 of FIG. 7 of the embodiment 2 of the present invention. The difference from the embodiment 1 (FIG. 9) is a point that a flag 2 is set by the validation confirmation flag (from step 1206 to step 1207).

In FIG. 11, at a step 1101, erased blocks are searched from the entry table. At a step 1102, the entry table is updated and the erased blocks are secured. At a step 1103, a kind of data, whether correctness confirmation is needed or not, is judged after executing the writing operation. When it is needed, process proceeds to a step 1104 and the validation confirmation flag provided in the RAM is set 1. When it is not needed, process proceeds to a step 1105 and the validation confirmation flag is set 0. The validation confirmation flag is a flag which is tentatively set for implementing program, and the flag is not to be written in the flash memory. Data are written in the blocks secured at the step 1106 (detail is shown in FIGS. 7 and 12).

At a step 1107, whether the validity confirmation flag is 1 (required) or not is judged. In the case where the validity confirmation flag is 1 (required), process proceeds to a step 1108 and the correctness of data received from the host is checked. For example, the data correction code and whether the value of data is normal or not are checked. At a step 1109, process braches according to the correctness check. In the case where the data are valid, process proceeds to a step 1110, 0 (valid) is overwritten in the flag 2 of the last page of a new block, and thereby the new block is validated. In the case where the validity confirmation flag=0 (not required) at the step 1107, process proceeds to a step 1111 since validation of a new block has already been done at the time of writing data at the step 1106 (refer to the explanation of FIG. 12 which will be described later). Since steps from 1111 to 1113 are the same as steps from 604 to 606 of FIG. 6, explanation thereof is omitted. In the case where the data are not valid in the step 1109, this flowchart is terminated.

At a step 1106 (FIG. 11), process shown in FIG. 7 is done. In FIG. 7, since the steps are the same as those of the embodiment 1, explanation thereof is omitted.

At a step 706 (FIG. 7) of the embodiment 2, process shown in FIG. 12 is done. In FIG. 12, since steps from 1201 to 1205 are the same as steps from 901 to 905 of the embodiment 1 (FIG. 9), explanation thereof is omitted. At a step 1205, in the case where it is the last page, process proceeds to 1206 and it is judged whether the validity confirmation flag is 1 (required) or not. In the case where the validity confirmation flag is 1 (required), process proceeds to a step 1207, the flag 2 is set 1 (not valid), and then this flowchart is terminated. In the case where the validity confirmation flag is 0 (not required), process proceeds to a step 1208, the flag 2 is set 0 (valid), and then this flowchart is terminated.

In the embodiment 2, writing processes take place more times by the process of judging data, the confirmation process and the overwriting in the flag 2, compared with the embodiment 1. Due to this, in the embodiment 2, the speed drops down from the viewpoint of the whole writing process. It is necessary to select speed or reliability on which the priority is to be placed, depending on the kind of data.

As has been described above, data necessary to be validated after judging their correctness can be responded to with a simple operation by applying the method of embodiment 1.

<<Embodiment 3>>

A memory device of embodiment 3 of the present invention will be explained. The embodiment 3 concerns validation of blocks in which new data have been written and invalidation of blocks in which old data are stored.

In the embodiment 2 of the present invention, new blocks are validated at the step 1110 of FIG. 11, and old blocks are invalidated at the step 1112. At this time, strictly speaking, there is a time momentarily in which both blocks are valid. Since both new and old blocks become valid in the rare case where interruption takes place after the step 1110 having been finished and just before the step 1112 ought to have been executed in the writing operation, a system control method by which writing operation in new and old blocks are done at the same time is proposed.

Namely, there are often the cases where the nonvolatile memory device is comprised of a plural number of flash memory chips. In the overwriting process of the same logical address, a rule that a new block is selected in the chip different from the chip of old block is provided, and validation of a new block and invalidation of an old block are executed at the same time. There is a premise that the structure is composed by a plural number of flash memory chips and furthermore the process of the plural number of flash memory chips can be executed simultaneously, but the parallel processing becomes more general in the structure in accordance with the recent high speed and large capacity processing.

The risk that old and new blocks are assigned to the same logical address can be further reduced by this process.

<<Embodiment 4>>

A memory device of embodiment 4 of the present invention will be explained. The embodiments 1 to 3 aimed for reducing largely the risk that physical addresses were duplicated for the same logical address with simple scheme, and the embodiment 4 is concerned with the protection process for the case where the duplication takes place nevertheless.

Using FIG. 13, the memory device of the embodiment 4 of the present invention will be explained.

Figure 13:
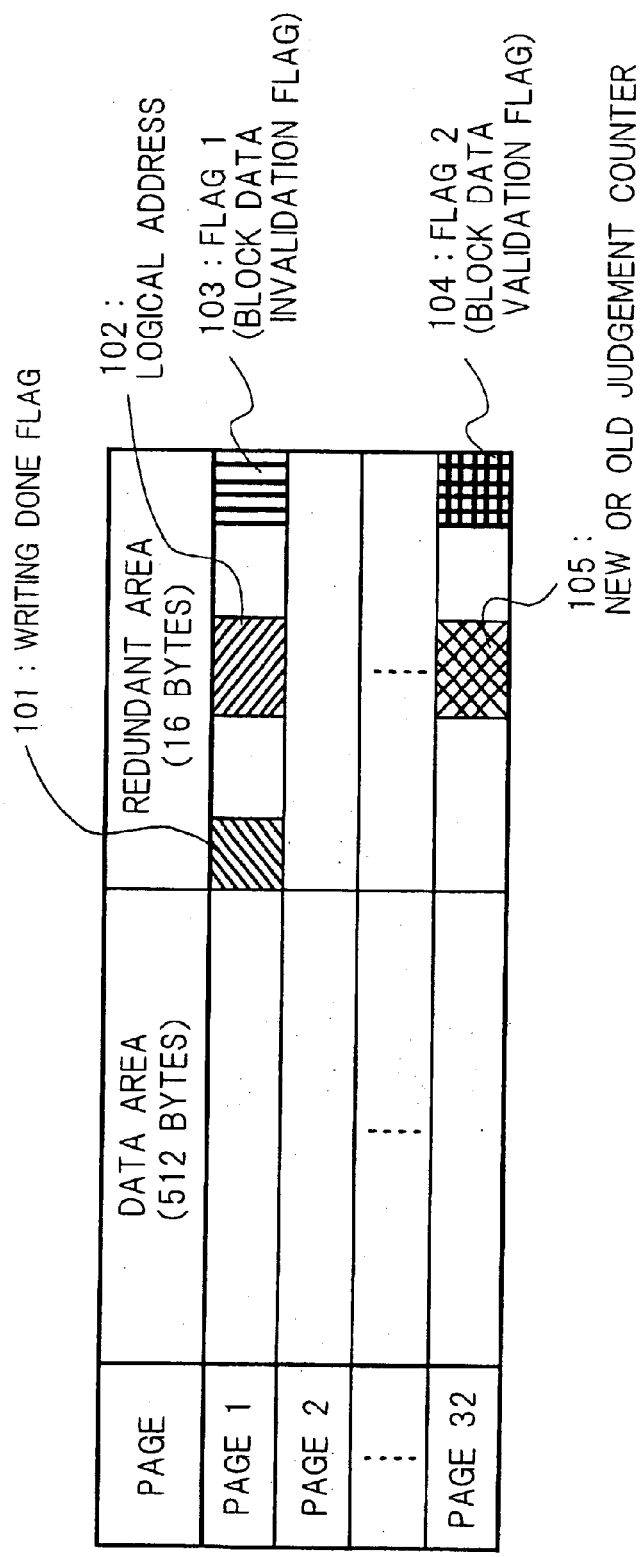
FIG. 13 is an example of a drawing showing a configuration in a flash memory physical block of an embodiment 4 of the present invention.

FIG. 13 is an example of a drawing showing a configuration in a physical block of a flash memory of the embodiment 4 of the present invention. It illustrates main data written in a redundant area of one physical block. Three, a writing done flag 101, a logical address 102 and a flag 1 103 that is a block data invalidation flag, are placed in the redundant area of the initial page. A flag 2 104 that is a block data validation flag and a counter 105 for judging the block new or old are placed in a redundant area of a last page. The difference from FIG. 3 of the prior art is that the flag 2 104 and the counter 105 are added. This explanation is described it as an 8-bit counter.

At first, a counter value is read out from the redundant area of old block at a time when new block is written. And, a value that is made by adding 1 to the counter value is written at a time when new data are written. For example, when the counter value of the old block is 4, the counter value of the new block becomes 5. Therefore, if both of duplicated new and old blocks have flags 101, 103 and 104 in a valid state and the correctness of both data is confirmed, it is possible to make it clear which is new and which is old by using this counter value, and to use it as a judging material for selecting either of the blocks according to the use of data. In general, if the writing operation of new data is completed, it is judged that an interruption took place just before the old data ought to have been erased, and new data are selected.

Hereupon, the counter processing coping with the overflow is executed as a matter of course. Explaining with the aforementioned example, a block whose counter value is larger is regarded as valid, but when the counter values are values of 0×ff and 0×00, the block of 0×00 is selected.

And, it is explained that, as for this counter value, a counter value of the new block is written by adding 1 to the counter value. But this is only an example, and it is also possible to subtract one from the counter value. And it is also possible to write the time and date instead of the counter value, and assignment of any numerical value is applicable as far as it becomes clear whether it is new or old.

As has been described above, in accordance with the invention of embodiments 1 to 3, the risk that the physical addresses are duplicated for assignment to the same logical address can be largely reduced, and in the case where the duplication takes place nevertheless, the protection process of the embodiment 4 can cope with it. The initial table generation process is realized by hardware, and software executes the process when the address duplication is found. By sharing roles like this, it is possible to construct a system that can operate at high speed keeping the reliability and is realizable.

The present invention is not limited to the embodiments described above. Changes are possible as far as not departing from the purpose of the invention.

In the above-mentioned embodiments, the flags are expressed by 1 or 0 of 1 bit, but the polarity can be changed depending on the erasing level of the flash and it is also possible to employ a means of making judgement by executing a majority decision process using a plural number of bits.

And, the explanation was given with a block as a unit of writing data, but the case where a multiple number of blocks are treated as a unit of writing is also applicable. Furthermore, the description has been done with the example in which writing in the flash is done in a page each time, but simultaneous writing in multiple pages is possible depending on the flash memory. And in such a multiple-page writing scheme, it is also possible to exchange any one of pages which were initially written and any one of pages which were last written since such simultaneous writing in multiple flash memory chips is possible.

And the explanation of the validation flag and invalidation flag has been given as being concerned with data, but they are not limited to the data. It is also applicable to other data in the redundant area which are different from intrinsic user's data and are used in the system and in which validation of new data and invalidation of old data are necessary because overwriting is done. According to the present invention, it is possible to reduce largely the risk that duplication of physical addresses for the same logical address is caused by interruption during overwriting, and to construct a system that can operate at high speed keeping reliability, without making any big change from or any big addition to the writing process and the generation process of the logical-physical address conversion table of the prior art.

Although the invention has been described in some detail dealing with the preferred embodiments, the configuration details of any of the preferred embodiments disclosed herein may be changed or modified, and any changes in the combination or order of elements thereof can be accomplished without departing from the spirit and scope of the invention as set forth in the appended claims.

INDUSTRIAL APPLICABILITY

As has been described above, the control method of a nonvolatile memory in accordance with the present invention is useful for the control method of a nonvolatile memory that executes readout and writing of data.

What is claimed is:

1. A control method of a nonvolatile memory having a plural number of blocks, wherein said block has a plural number of pages, said page has data area for writing data and redundant area, said redundant area of initial said page of said block has a block data invalidation flag indicating whether said data written in the block are invalid or not and indicating that said data are not invalid at the state that the nonvolatile memory is erased, and said redundant area of last said page of said block has a block data validation flag indicating whether said data written in the block are valid or not and indicating that said data are not valid at the state that the nonvolatile memory is erased, having:

a data writing step of writing data in said data area; and a validation step of making said block data validation flag of said block having said data area in which said data are written to indicate that said data are valid.

2. A control method of a nonvolatile memory according to claim 1 characterized in further having a selecting step of selecting, by hardware or software, a method in which said validation step is executed simultaneously with or succeeding said data writing step or a method in which a data correctness check is executed after said data writing step and then said validation step is executed.

3. A control method of a nonvolatile memory according to claim 1 characterized in, in the case where original data are updated to new data, executing simultaneously the validation step on said block in which said new data are written and the invalidation step of making said block data invalidation flag of said block in which said original data are written to indicate that said original data are invalid.

4. A control method of a nonvolatile memory according to claim 1 characterized in that said redundant area further has logical addresses and history information of said data written in said block; and in the case where there are a plural number of blocks having the same said logical address, it has further a judgment step of judging the data of which block is valid at present, based on said history information.

5. A nonvolatile memory characterized in having a plural number of blocks, wherein said block has a plural number of pages;

said page has data area for writing data and redundant area;

said redundant area of initial said page of said block has a block data invalidation flag indicating whether said data written in the block are invalid or not and indicating that said data are not invalid at the state that the nonvolatile memory is erased;

said redundant area of last said page of said block has a block data invalidation flag indicating whether said data written in the block are valid or not and indicating that said data are not valid at the state that the nonvolatile memory is erased; and the block data validation flag of at least one said block indicates that said data are valid.

6. A nonvolatile memory according to claim 5 characterized in that said redundant area further has logical addresses and history information of said data written in said block.

* * * * *